United States Patent
Iff (10) Patent No.: US 11,959,736 B2
(45) Date of Patent: *Apr. 16, 2024

(54) METHOD AND A SYSTEM FOR CHARACTERISING STRUCTURES ETCHED IN A SUBSTRATE

(71) Applicant: UNITY SEMICONDUCTOR, Montbonnot-Saint-Martin (FR)

(72) Inventor: Wolfgang Alexander Iff, Domène (FR)

(73) Assignee: UNITY SEMICONDUCTOR, Montbonnot-Saint-Martin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 18/318,919

(22) Filed: May 17, 2023

(65) Prior Publication Data

US 2023/0375332 A1     Nov. 23, 2023

(30) Foreign Application Priority Data

May 19, 2022    (EP) .................................... 22305742

(51) Int. Cl.

| | | |
|---|---|---|
| G01B 11/22 | (2006.01) | |
| G01B 9/02 | (2022.01) | |
| G01B 9/02015 | (2022.01) | |
| G01B 9/02055 | (2022.01) | |
| G01B 9/0209 | (2022.01) | |
| G01B 11/04 | (2006.01) | |
| H01L 21/66 | (2006.01) | |

(52) U.S. Cl.
CPC ............ *G01B 11/22* (2013.01); *G01B 9/0203* (2013.01); *G01B 9/02038* (2013.01); *G01B 9/02063* (2013.01); *G01B 9/02069* (2013.01); *G01B 9/0209* (2013.01); *G01B 11/046* (2013.01); *H01L 22/12* (2013.01)

(58) Field of Classification Search
CPC .............. G01B 9/0203; G01B 9/02063; G01B 9/02069; G01B 9/0209; G01B 11/028; G01B 11/22

See application file for complete search history.

(56) References Cited

U.S. PATENT DOCUMENTS

| | | |
|---|---|---|
| 8,213,022 B1 | 7/2012 | Riza et al. |
| 2002/0048025 A1 | 4/2002 | Takaoka |

(Continued)

FOREIGN PATENT DOCUMENTS

| | | |
|---|---|---|
| WO | 2007042676 A1 | 4/2007 |
| WO | 2016084195 A1 | 6/2016 |

OTHER PUBLICATIONS

Search Report received for European Application No. 22305742.3, dated Dec. 6, 2022.

*Primary Examiner* — Michael A Lyons (74) *Attorney, Agent, or Firm* — Greer, Burns & Crain, Ltd (57) ABSTRACT

A method for characterising high aspect ratio ("HAR") structures etched in a substrate includes, for at least one structure, an interferometric measurement step, carried out with a low-coherence interferometer positioned on a top surface of the substrate, for measuring with a measurement beam, at least one depth data relating to a depth of the HAR structure, and a first adjusting step for adjusting a diameter, at the top surface, of the measurement beam according to at least one top critical dimension ("top-CD") data relating to a width of the HAR structure.

15 Claims, 4 Drawing Sheets

(56) References Cited

U.S. PATENT DOCUMENTS

| | | | |
|---|---|---|---|
| 2010/0321700 A1* | 12/2010 | Hirose | A61B 3/102 356/450 |
| 2011/0279823 A1 | 11/2011 | Ueki | |
| 2013/0038863 A1 | 2/2013 | Fresquet | |
| 2013/0206992 A1* | 8/2013 | Jin | G01B 11/12 250/353 |
| 2015/0228069 A1* | 8/2015 | Fresquet | G01N 21/9501 348/87 |
| 2015/0243024 A1 | 8/2015 | Fresquet et al. | |
| 2022/0136822 A1* | 5/2022 | Fresquet | G01M 3/20 356/498 |
| 2022/0357236 A1* | 11/2022 | Courteville | G01B 11/2441 |
| 2022/0397392 A1* | 12/2022 | Courteville | G01B 9/0209 |

* cited by examiner

METHOD AND A SYSTEM FOR CHARACTERISING STRUCTURES ETCHED IN A SUBSTRATE

BACKGROUND

The present invention relates to a method for characterising structures, and in particular high aspect ratio, HAR, structures, etched in a substrate. It also relates to system for carrying out such a method.

The field of the invention is the field of the inspection and the characterization of structures etched in a substrate, such as high aspect ratio structures, for example Through-Silicon Vias, TSV, or trenches, etched in a substrate, such as a wafer for example.

In the semiconductor industry, or the MEMs (for "Microelectromechanical systems") industry for instance, many process steps involve etching structures with sometimes high aspect ratio, HAR, in substrates such as silicon. Such a HAR structures may be for instance Through Silicon Vias (TSVs) which are usually blind holes used for example for interconnections in advanced packaging techniques, trenches with narrow width and elongated length, and more complex features. They may be done by Deep Radiative Ion Etching (Deep RIE) or photolithography techniques for instance.

The aspect ratio of a HAR structure is defined by the ratio between the depth and a lateral dimension, also called "critical dimension" (CD) of the HAR structure. Some HAR structures may have aspect ratio larger than 5, or 10 or 20, with lateral (critical) dimensions as narrow as 5 µm or less. Some non-limitative examples comprise TSVs in the form of cylindrical holes with diameter of 2-3 µm and depth of 40-50 µm, etched in silicon substrates.

There is a need to measure and characterize these structures, and in particular HAR structures by measuring for instance their depth. The document WO 2007/042676 describes a technique for depth measurement of a HAR structure during deep RIE process. This technique has however some limitations for measuring HAR structure with very small critical dimensions (4 µm or less, for example). There are also known techniques for characterizing dense arrays of HAR structures. These techniques cannot be used to characterize a HAR structure individually.

A purpose of the present invention is to overcome at least one of the drawbacks of the known techniques.

Another purpose of the invention is to provide a solution to characterize etched structures, and in particular HAR structures individually.

Another purpose of the invention is to provide a solution to characterize etched structures, and in particular HAR structures, of small critical dimension.

Another purpose of the invention is to provide a solution to measure depth and critical dimension of etched structures, and in particular HAR structures.

It is also a purpose of the present invention to provide a solution to characterise structures, and in particular HAR structures more efficiently and/or faster.

SUMMARY

The invention makes it possible to achieve at least one of these aims by a method for characterising structures, and in particular high aspect ratio, HAR, structures etched in a substrate, such as a wafer, said method comprising, for at least one structure, at least one interferometric measurement step, carried out with a low-coherence interferometer positioned on the top side of said substrate, for measuring with a measurement beam positioned on the structure, at least one depth data relating to a depth of said structure.

According to a first aspect of the invention, the method may also comprise a first adjusting step for adjusting a diameter, at said top surface, of the measurement beam according to at least one top-CD data relating to a width of said structure Thus, according to this first aspect, the present invention proposes adapting the diameter of the measurement beam to the width of the at least one, and in particular each, structure or HAR structure, according to top-CD data relating to said structure. The top-CD data represents a valuable information regarding the width, or a lateral dimension, of the structure at the surface of the substrate. This top-CD or lateral dimension can be for instance a diameter of a hole, or the width of the smallest lateral dimension of a trench. Thus, as an advantageous feature, the present invention proposes using the top-CD data of the structure, for adjusting the diameter of the interferometric measurement beam used for measuring the depth data of the structure. Thus, the interferometric measurement step may be realized faster and allows a more accurate measurement of the depth of the structure, even for structures of small critical dimension. In addition, structures and HAR structures with smaller CD and/or larger aspect ratio can be measured efficiently.

In the present document a "high aspect ratio structure" or "HAR structure" or "HARS" designate a structure with an aspect ratio greater than, or equal to, 5, or 10, or even 20.

For example, a HAR structure may be a Through Silicon Via (TSV), a trench, and a more complex feature, etched in a support such as a wafer. Some non-limitative examples comprise TSVs in the form of cylindrical holes with diameter of 2-3 µm and depth of 40-50 µm, etched in silicon substrates.

In the present document, by "top side", respectively "top surface", of a substrate corresponds to the side, respectively to the surface, of the substrate on which the structure(s) is(are) etched.

The method according to the first aspect of the invention proposes adjusting, for at least one structure, or HAR structure, the diameter, on the top surface of the substrate, of the measurement beam emitted by the interferometer, according to a top-CD of the said HAR structure. This allows to have most of the incident measurement beam entering the structure, and in particular a HAR structure, while only a small part of it is reflected at the top surface. Due to the rather small ratio of diameter or top-CD vs. illumination wavelengths (often below 15) which leads to strong diffraction effects, and often also due to absorbing properties of the involved materials, e.g. silicon, or more generally speaking due to the conditions of propagation of light into these structures, the losses inside these structures are high, and only a small part of the incoming light is reflected from the bottom of the structure and coupled back into the interferometer. So, the invention according to the first aspect allows to optimize the sensitivity of the interferometric measurements by using most of the incident power to compensate for the high losses, in particular in the HAR structures, and obtain more balanced interference signals.

The diameter of the measurement beam, on the top surface, may be adjusted for instance to be between 0.8 and 2 times the smallest transverse dimension of the structure, which can be for instance the diameter or the section of a TSV, or the width of a trench. It can also be adjusted to be between 0.3 or 0.5 and 5 times the smallest transverse dimension of the structure and still produce exploitable signals.

The diameter of the measurement beam may be for instance defined as the portion of the beam with 90% or 99% of the incoming power. With a Gaussian beam, the diameter of the measurement beam, on the top surface, may also be for instance defined as the portion of the beam with a local intensity higher than $1/e^2$ of the peak intensity, corresponding to 86.5% of the power.

This diameter can also be adjusted so that at least 75%, or 80%, or 90% of the incoming power is coupled into the structure.

As a matter of example, measurement beam diameter sizes of 5 µm diameter, or 3 µm, may be used to measure HAR structures, and in particular TSVs, of diameter 3 µm.

The optimum portion of light focused into the structure depends notably on the losses of light inside the structure and therefore the structure shape (e.g. its aspect ratio). Deeper and narrower HAR structures, for example TSVs or trenches, as well as HAR structures with strongly curved bottoms require the coupling of a large portion of the incoming power into them and therefore a small beam diameter whereas shallow or broad structures require only the coupling of a smaller portion of the incoming power into them. This is a reason for the choice of an adaptable beam size on the top surface of the substrate.

Another advantage of the adjustment of the size of the measurement beam is that the measurement beam is limited enough to cover only one structure, even for arrays of structures close to each other, which allows ensuring that the structures can be individually characterized.

In some embodiments, for at least one structure, the top CD-data may be a priori known data. In this case, the method according to the invention may comprise, before the first adjusting step, a step for reading the top-CD data in a memory.

Indeed, in some cases, the top-CD data may be provided because said top-CD data is determined during the design or the manufacturing of the substrate. In these cases, the top-CD data may be stored in a memory and read during the method according to the invention. In these embodiments, the characterization of the HAR structures may be done faster because no prior measurement of the top-CD data is necessary.

In some cases, at least two, and in particular all, structures of a substrate may be identical. In such cases, the top-CD data may be read once for at least two of said structures and used for each of the said at least two structures.

Alternatively, or in addition, at least two, and in particular all, structures of a substrate may be different. In such cases, the top-CD data may be read individually for each structure and used for said structure.

In some embodiments, the method according to the invention may comprise a second adjusting step for adjusting the diameter of the measurement beam according to at least one characteristic of an interferometric signal measured by the interferometer.

The second adjusting step may be carried out during or after the first adjusting step.

The second adjusting step allows an adjustment of the diameter of the measurement beam during the measurement step, and allows adjustment of the measurement beam, especially in real condition and in real time, when the measured interferometric signal indicates that the diameter of the measurement beam is not adapted to the structure under inspection.

The at least one characteristic of the measured interferometric signal may comprise at least one of the following characteristics:
 a visibility, or a modulation depth, possibly relative to an average value, of interference fringes or a spectral modulation of the measured interferometric signal, and/or
 an amplitude relative to noise of the measured interferometric signal, and/or
 a value of depth data as provided by the interferometric signal.

Thus, if one of these characteristics has not an expected value, or has a value that is not in an expected range, this indicates that the diameter of the measurement beam is not adapted to the structure under inspection. The diameter of the measurement beam may be adjusted consequently.

Alternatively, or in addition, an optimization process may be carried out, for instance using a gradient-based algorithm, to find the diameter of the measurement beam for which at least one characteristic of the measured interferometric signal is optimized, or reaches a local extremum.

In some embodiments, the method according to the invention may comprise a third adjusting step for adjusting the position of the measurement beam relative to the structure according to at least one characteristic of an interferometric signal measured by the interferometer.

The third adjusting step may be carried out during or after the first adjusting step.

The third adjusting step allows an accurate adjustment of the position of the measurement beam during the measurement step, especially in real condition and in real time, so as to optimize the conditions of measurement of the depth data for the structure of interest.

The at least one characteristic of the measured interferometric signal may comprise at least one of the following characteristics:
 a visibility, or a modulation depth, possibly relative to an average value, of interference fringes or a spectral modulation of the measured interferometric signal,
 an amplitude relative to noise of the measured interferometric signal,
 a value of depth data as provided by the interferometric signal.

Thus, if one of these characteristics has not an expected value or has a value that is not in an expected range, this indicates that the position of the measurement beam with respect to the structure is not optimal. The position of the measurement beam may be adjusted consequently.

Alternatively, or in addition, an optimization process may be carried out, for instance using a gradient-based algorithm, to find the position of the measurement beam for which at least one characteristic of the measured interferometric signal is optimized, or reach a local extremum.

According to a second aspect of the invention, that may be used alone or in combination with the other aspects of the invention, the method according to the invention may further comprise at least one imaging step comprising the following steps:
 capturing, with an imaging device positioned on the top side of said substrate, at least one image of said top surface, and
 measuring a first data relating to a structure from at least one captured image.

The first data relating to the structure represents a valuable information regarding said structure, as it will be explained further. As an advantageous feature, said the first data, i.e. the information regarding the structure, may be used for adjusting the measurement beam for measuring the depth data of the structure. Thus, the interferometric measurement step may be realized faster and allows a more efficient and accurate measurement of the depth of the structure.

In some embodiments, for at least one structure, the first data relating to said structure may be deducted from a single image captured by the imaging device. Alternatively, or in addition, for at least one structure, the first data relating to said structure may be deducted from several images captured by the imaging device.

In some embodiments, for at least one structure, at least one image captured by the imaging device may relate only to said structure: in this case the captured image only comprises information regarding said structure and does not comprise information regarding any other structure.

Alternatively, or in addition, at least one image captured by the imaging device may relate to several, and in particular to all, structures of the substrate: in this case the captured image comprises information regarding each of said structures so that it is possible de determine the first data for each of said structures by processing said captured image. For example, it is possible to carry out an imaging step capturing an image of the substrate, before the first interferometric measurement step. The captured image may comprise the whole top surface of the substrate. Said captured image may then be processed to determine the first data for each HAR structure of the substrate.

In some embodiments, for at least one structure, the first data relating to said structure may comprise the top-CD data used during the first adjusting step for adjusting the diameter of the measurement beam.

Thus, the imaging step provides the top-CD data, the latter being then used during the first adjusting step for adjusting the diameter of the measurement beam.

Thus, the method according to the invention allows faster and more accurate measurement of the depth of structures of a substrate when the top-CD data of said structures are not known, and/or when the substrate comprises different structures with different top-CDs.

Alternatively, or in addition, for at least one structure, the first data may comprise a position data relating to a position of the structure on the top surface. In this case, the method according to the invention may comprise a fourth adjusting step for adjusting the position, on said top surface, of the measurement beam according to said position data.

Thus, the imaging step provides a data information relative to the position of the structure by processing at least one image captured, during the imaging step, by the imaging device. The position of said structure on the substrate is then used for faster and more accurate positioning of the measurement beam so that the measurement of the depth of structures of a substrate is carried out faster and more accurately compared to known techniques.

The position of the measurement beam may then be further optimized by carrying out a/the third adjusting step for positioning the measurement beam relative to the structure according to at least one characteristic of an interferometric signal measured by the interferometer as previously explained. Then these fourth and third adjusting steps provide a coarse and fine positioning of the measurement beam which allow fast and accurate measurements.

According to some embodiments, the imaging step and the interferometric measurement step may be carried out through respective light paths having a common portion. In this case, the method according to the invention may also comprise synchronization, by a synchronization unit, of said imaging step and said interferometric measurement step so that said steps are carried out sequentially, or in turn.

Such a method allows characterising structures etched in the substrate faster and with a less bulky and less expensive system than systems of the prior art. Indeed, the imaging step and the interferometric measurement step may share common optical components, and both measurements may be carried out without the need to move the measurement system relative to the substrate between measurements.

But above all, the synchronization makes it possible to carry out the imaging step and the interferometric measurement step in turn so that none of these steps disturbs the other step. In other words, the interferometric measurement step may be carried out without disturbances that may be caused by the imaging step. Likewise, the imaging step may be carried out without the disturbances that the interferometric measurement step, and in particular the interferometric measurement beam, may cause to said imaging step. Thus, the imaging step may carry out more accurate imaging so that the first data may be determined in a more accurate fashion. Likewise, the interferometric measurement step may carry out more accurate interferometric measurement so that the depth data may be determined in a more accurate fashion.

The synchronization of the imaging step and the interferometric measurement step may be carried out in different ways, implemented alone or in combination.

According to some embodiments, the synchronization may be carried out by controlling a position of a shutter located between the interferometer and the common portion. This shutter may be movable between:
  a closed position blocking the passage of the measurement beam, and
  an open position authorizing the passage of said measurement beam.

When the imaging step is carried out the shutter may be moved to the closed position preventing the passage of the measurement beam: the latter doesn't disturb the imaging step. After the imaging step is carried out, the shutter may be moved to the open position authorizing the passage of the measurement beam so that the interferometric measurement may be carried out.

Alternatively, or in addition, the synchronization may be carried out by controlling a position of a mirror located between the interferometer and the common portion. This mirror may be movable between:
  a closed position deflecting the measurement beam away from the structure under inspection, and
  an open position directing said measurement beam towards said structure.

When the imaging step is carried out, the mirror may be moved to the closed position: the measurement beam is deflected away from the HAR structure, or even from the substrate. After the imaging step is carried out, the mirror may be moved to the open position deflecting the measurement beam towards the structure: interferometric measurement may be carried out.

Alternatively, or in addition with at least one of the previous synchronization options, the synchronization may be carried out by controlling a position of an optical filter, such as a neutral density filter or a spectral filter, located between the interferometer and the common portion. This filter may be movable between:
  a closed or strongly attenuating position filtering the measurement beam, and
  an open position letting the measurement beam pass.

When the imaging step is carried out, the optical filter may be moved to the closed position: the measurement beam is filtered out, or strongly attenuated, and does not pass (at least significantly) towards the HAR structure. After the imaging step is carried out, the optical filter may be moved to the open position: the measurement beam passes said filter so that the interferometric measurement step may be carried out.

Alternatively, or in addition with at least one of the previous synchronization options, the synchronization may be carried out by controlling an attenuation value of an attenuating device located between the interferometer and the common light path portion, attenuating the measurement beam during the imaging step and not attenuating the measurement beam otherwise.

Alternatively, or in addition with at least one of the previous synchronization options, the synchronization may be carried out by switching on and off an interferometer light source. Thus, the light source may be switched off during the imaging step, and switched on for interferometric measurement step.

Alternatively, or in addition to at least one of the previous synchronization options, the synchronization may be carried out by triggering acquisition of image(s) by the imaging device with respect to the pulses of a pulsed light source of the interferometer such that image acquisition is carried out between the pulses of said source. In this case, the light source of the interferometer is a pulsed light source with a given frequency for the pulses, or with pulses triggered by the synchronization unit. The imaging device may be triggered between the pulses, or controlling the pulses, or being triggered by the synchronization unit along with the pulsed light source, so that at least one image is captured when the pulsed light source does not emit a pulse of light.

The present invention proposes adjusting the diameter of the measurement beam on the top surface in the first aspect of the invention, and optionally in the second aspect of the invention. The adjustment of the diameter of the measurement beam on the top surface may be carried out in different ways, that may be implemented alone or in combination.

In some embodiments, the adjustment of the diameter, on the top surface, of the measurement beam may be carried out by changing at least one optical element, such as a lens or a beam expander, placed between the interferometer and the top surface. The changing of the optical element may be realized by any means. For example, the change of the optical element may be realized with a turret moving or supporting said at least one optical element.

Alternatively, or in addition, the adjustment of the diameter, on the top surface, of the measurement beam may be carried out by changing at least one focal length of an optical element, such as a lens or a zoom arrangement, placed between the interferometer and the top surface. The change of the focal length of the optical element may be carried out for instance by modifying the shape or the propagation properties of a deformable lens or a meta-lens, or by changing a magnification ratio of said optical element, or the position of a component of a zoom arrangement composing said optical element.

Alternatively, or in addition with at least one of the previous options, the adjustment of the diameter, on the top surface, of the measurement may be carried out by changing a numerical aperture of the measurement beam on the top surface. The numerical aperture of the measurement beam may be changed by using a beam expender in a collimated beam path or an aperture stop.

The invention also relates to a system for characterising structures, and in particular high aspect ratio, HAR, structures etched in a substrate, such as a wafer, said system comprising a low-coherence interferometer, arranged on the top side of said substrate, for measuring with a measurement beam positioned on the structure at least one depth data relating to a depth of said structure, and in particular of said HAR structure.

According to the first aspect of the invention, the system according to the invention may also comprise an adjustment unit for adjusting a diameter, at the top surface, of the measurement beam according to at least one top-CD data relating to a width of said structure.

As described above, in some embodiments, the top-CD data may be a priori known data, for at least one structure. In this case, the system according to the invention may comprise a memory for storing said top-CD data.

The memory may be a local or a distant memory.

The memory may be a removable memory or not.

The memory may be a volatile or a permanent medium.

The top-CD data may be stored as numerical values in a volatile or non-volatile memory, or in a data file of any format in a permanent storage medium.

The memory may be integrated into the interferometer, or to the adjustment unit, or to another device of the system, or may be a standalone component belonging to the system.

According to the second aspect of the invention, the system according to the invention may also comprise an imaging unit. The imaging unit may comprise:
 an imaging device, arranged on the top side of said substrate, for capturing at least one image of a top surface of the substrate, and
 a processing unit for measuring a first data relating to the structure from at least one image captured by the imaging device.

The imaging unit may be configured to carry out the imaging step as described above.

For at least one structure, the imaging unit may provide a first data comprising, or consisting in, the top-CD data of said structure.

For at least one structure, the imaging unit may provide a first data comprising, or consisting in, a position data relating to a position, on the top surface, of said structure.

In some embodiments, the system according to the invention may also comprise a positioning unit for adjusting the position, on the top surface of the substrate, of the measurement beam.

The position of the measurement beam may be adjusted according to a position data. This position data may be or comprise:
 a pre-defined value stored for instance in a memory;
 the position data provided by the imaging unit for at least one structure.

Alternatively, or in addition, the position of the measurement beam may be adjusted according to at least one characteristic of the interferometric signal measured by the interferometer, as previously explained.

The positioning unit may comprise a holder for the substrate, and/or a holder for the interferometer.

The positioning unit may adjust the position on the top surface, of the measurement beam, by:
 moving the interferometer with respect to the substrate; and/or
 moving the substrate with respect to the interferometer.

In some embodiments, for adjusting the diameter, on the top surface, of the measurement beam, the adjustment unit may comprise at least one of the following:

a turret for changing at least one optical element, such as a lens or a beam expander, placed on the path of the measurement beam between the interferometer and the top surface;

an optical element, such as a lens or a zoom lens, with adjustable focal length, placed on the path of the measurement beam between the interferometer and the top surface; and/or a beam expander with adjustable numerical aperture, placed on the path of the measurement beam between the interferometer and the top surface.

In some embodiments, respective light paths of the imaging unit and of the interferometer may have a common portion. In this case, the system according to the invention may also comprise a synchronization unit so that said imaging unit and said interferometer are used sequentially, or in turn.

For synchronizing the imaging unit and the interferometer, the synchronization unit may comprise at least one of the following:

a shutter located between the interferometer and the common portion, and moveable between a first position blocking the passage of the measurement beam and a second position authorizing the passage of said measurement beam;

a mirror located between the interferometer and the common portion, and moveable between a first position deflecting the passage of the measurement beam away from the structure and a second position deflecting said measurement beam towards said structure;

an optical filter, such as a neutral density filter or a spectral filter, located between the interferometer and the common portion, and moveable between a first position filtering the measurement beam, so as to block it or attenuate it strongly, and a second position letting the measurement beam pass;

an attenuating device, such as an electro-optic attenuator, located between the interferometer and the common light path portion, the attenuation value of which is controllable;

a controller switching on and off an interferometer light source;

a controller controlling the imaging device and/or the light source so as to trigger acquisition of image(s) by the imaging device with respect to the pulses of a pulsed light source of the interferometer such that image acquisition is carried out between the pulses of said source.

In some embodiments, the imaging unit may comprise a light source and a camera, optionally combined with a microscope optical arrangement.

In some embodiments, the interferometer is coupled to an optical fibre conveying the measurement beam and the reflected light. The optical fiber may be a single-mode fiber.

The interferometer may be for instance a time domain interferometer. In that case, it comprises a broadband source (not shown) emitting a polychromatic light. It further comprises an optical delay line which allows varying an optical path difference between two beams. When the optical path difference between the beams reflected respectively at the top and the bottom of the structure, or between these respective beams and a reference beam, is reproduced by the delay line, an interference burst, or fringe, can be observed on a photodetector, allowing measuring this optical path difference. The depth of the structure is deducted from said optical path difference.

The interferometer may also be a spectral domain interferometer. In that case, it comprises a broadband source (not shown) emitting a polychromatic light, and a spectrometer for a spectral analysis of the reflected light. The spectrum obtained by combining the light reflected respectively by the top and the bottom of the structure on the spectrometer exhibit well known patterns such as modulation whose analysis can provide the optical path difference between the superposed beams. The depth of the structure is deducted from said optical path difference.

The interferometer may also comprise a swept source interferometer, with a tunable laser emitting a monochromatic light with an optical frequency varying temporally over a spectral range. The intensity of the reflected light is measured by a photodetector, so as to reconstitute a spectrum, whose analysis allows also to measure the optical path difference between the reflected beams, and with this the depth of the structure.

The interferometer may be for example similar to the one described in the document published under the number WO2007/042676.

BRIEF DESCRIPTION OF THE DRAWINGS

Other advantages and characteristics will become apparent on examination of the detailed description of an embodiment which is in no way limitative, and the attached figures, where.

DETAILED DESCRIPTION

It is well understood that the embodiments that will be described below are in no way limitative. In particular, it is possible to imagine variants of the invention comprising only a selection of the characteristics described hereinafter, in isolation from the other characteristics described, if this selection of characteristics is sufficient to confer a technical advantage or to differentiate the invention with respect to the state of the prior art. Such a selection comprises at least one, preferably functional, characteristic without structural details, or with only a part of the structural details if this part alone is sufficient to confer a technical advantage or to differentiate the invention with respect to the prior art.

In the FIGURES, elements common to several figures retain the same reference.

Figure 1:
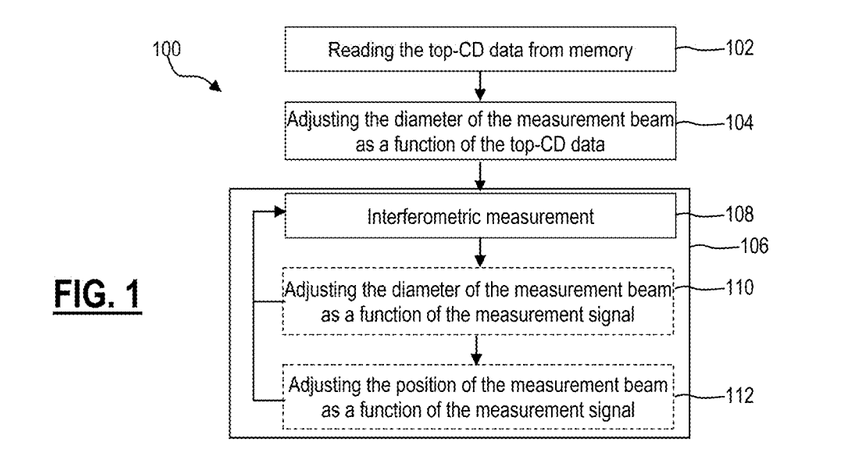
FIGS. 1-3 are diagrammatic representations of non-limitative examples of a method according to the invention.

FIG. 1 is a diagrammatic representation of a non-limitative example of a method according to the present invention.

The method 100, shown in FIG. 1, may be used to characterise, structures, and in particular high aspect ratio, HAR, structures etched in a substrate, such as a wafer. More particularly, the method 100 of FIG. 1 may be used to measure the depth of structures etched in the substrate.

The method 100 comprises step 102 for reading, for at least one structure, an a-priori known top-CD data from a memory. The top-CD data is a data relative to the width of the structure, and more particularly the width of the structure at the top side of said structure, i.e. on a top surface of the substrate. For example, the top-CD data may be determined during the design or the manufacturing of the substrate, and stored in said memory.

In some cases, at least two, and in particular all, structures of a substrate may be identical. In such cases, the top-CD data may be read once for said structures and used for every one of said structures, i.e. for several iterations of an interferometric measurement step for measuring a depth data for each of said structures.

In some cases, at least two, and in particular all, structures of a substrate may be different. In such cases, the top-CD data may be read individually for each of said structures.

Advantageously, the method 100 comprises a step 104 for adjusting the diameter, on a top surface of the substrate, of a measurement beam used for interferometric measurement of a depth data, according to the top-CD data. The diameter of the measurement beam is adjusted in order to make sure that the measurement beam enters the structure and reaches the bottom of the structure with enough power, in particular for HAR structures, in order to measure the depth of the structure.

The method 100 comprises, after the adjustment step 104, for at least one structure, an interferometric measurement step 106 during which a depth data relating to the depth of said structure is measured by optical interferometry.

The interferometric measurement is carried out by a low coherence optical interferometer arranged on the top side of the substrate. Optical interferometry is a well-known technique and therefore will not be described in detail here. In short, a measurement beam of broadband light is sent to the structure. At least part of said measurement beam is reflected by the structure, respectively at the top or the surface of the substrate, and at the bottom of the structure. The reflected beams are made to interfere with each other or with a reference beam issued from the same source, to obtain an interference signal whose analysis provides the depth data.

The measurement step 106 comprises at least one interferometric measurement 108 providing a measurement signal as explained above. This measurement signal may then be processed to obtain the depth data.

The method 100 may optionally comprise a second adjusting step 110, especially during the measurement step 106, for adjusting the diameter of the measurement beam according to at least one characteristic of the interferometric signal measured by the interferometer. This second adjusting step 110 allows real time adjustment of the diameter of the measurement beam as a function of the measured signal. For example, the diameter of the measurement beam may be adjusted as a function of:
- a visibility or a modulation depth, possibly relative to an average value, of interference fringes or a spectral modulation of the measured interferometric signal; and/or
- an amplitude relative to noise of the measured interferometric signal; and/or
- a value of depth data as provided by the interferometric signal.

Thus, if one of these characteristics has not an expected value, or has a value that is not in an expected range of values, this indicates that the diameter of the measurement beam is not adapted to the structure under inspection. The diameter of the measurement beam may be adjusted consequently as explained later. The process may be repeated iteratively, using for instance a gradient-based algorithm, to find the diameter of the measurement beam for which at least one characteristic of the measured interferometric signal is optimized, or reach a local extremum.

The method 100 may optionally comprise a third adjusting step 112, especially during the measurement step 106, for adjusting the position of the measurement beam according to at least one characteristic of the interferometric signal measured by the interferometer. This third adjusting step 120 allows real time adjustment of the position of the measurement beam as a function of the measured signal. For example, the position of the measurement beam may be adjusted as a function of:
- a visibility or a modulation depth, possibly relative to an average value, of interference fringes or a spectral modulation of the measured interferometric signal; and/or
- an amplitude relative to noise of the measured interferometric signal; and/or
- a value of depth as provided by the interferometric signal.

Thus, if one of these characteristics has not an expected value, or has a value that is not in an expected range of values, this indicates that the position of the measurement beam with respect to the structure is not optimal. The position of the measurement beam with respect to the structure may be adjusted consequently, as explained later. The process may be repeated iteratively, using for instance a gradient-based algorithm, to find the position of the measurement beam for which at least one characteristic of the measured interferometric signal is optimized, or reach a local extremum.

The second adjusting step 110 and the third adjusting step 112 may be executed simultaneously, or sequentially, in any order. Alternatively, only one or none of them may be executed. After at least one of these steps is carried out, at least one another interferometric measurement 108 may be carried out. Steps 108 and 110, 120 may thus be repeated until the interferometric measurement is successful.

Figure 2:
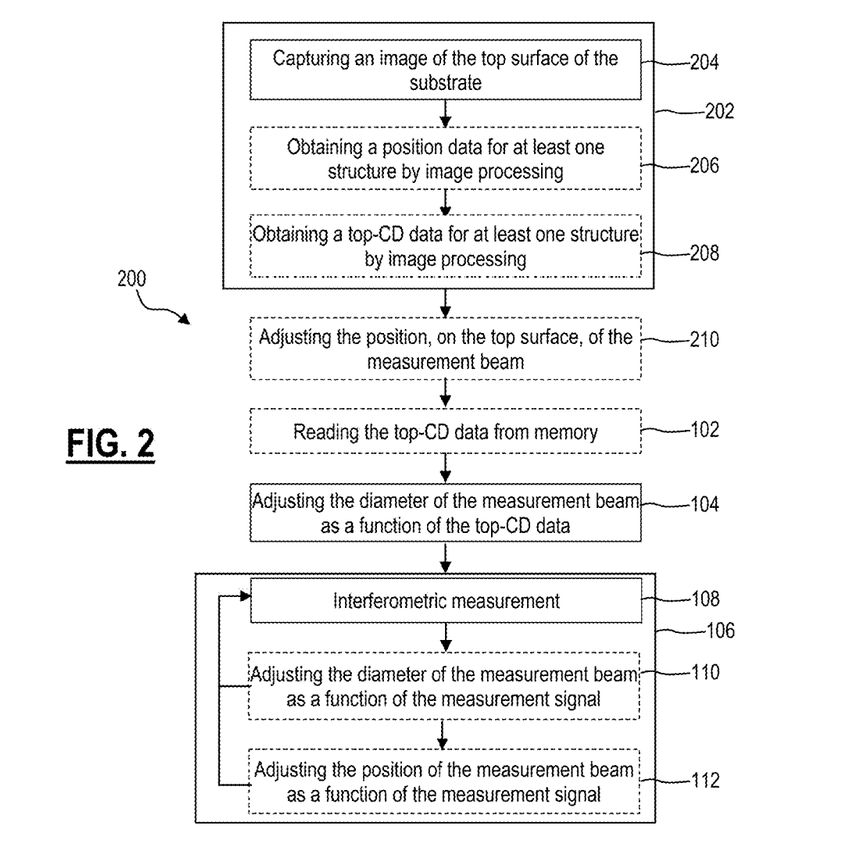

FIG. 2 is a diagrammatic representation of another non-limitative example of a method according to the present invention.

The method 200, shown in FIG. 2, may be used to characterize structures, and in particular HAR structures etched in a substrate, such as a wafer. More particularly, the method 200 of FIG. 2 may be used to measure the depth of structures etched in the substrate.

The method 200 comprises an imaging step 202 of the substrate.

The imaging step 202 comprises a step 204 for capturing at least one image of the top surface of the substrate, for example by an imaging unit. The imaging unit may comprise a camera, optionally associated with a microscope and a light source, for imaging the top surface of the substrate. The captured image may comprise the whole top surface or only a portion of said top surface. The captured image may comprise only one structure etched in the substrate, or several, in particular all, structures of said substrate.

The captured image may then be processed, at a processing step 206, for identifying a position data relative to the position of at least one structure visible in the captured image. The processing of the image for determining the position data may be done according to commonly known image processing methods, using for instance segmentation, pattern recognition or blob analysis algorithms.

The captured image may be processed, at a processing step 208, for identifying a top-CD data relative to at least one structure visible on the captured image. The processing of the image for determining the top-CD data may be done according to commonly known image processing methods. For instance, once a structure has been located and identified, its critical dimensions can be obtained by using a pattern analysis algorithm and an imaging system calibrated in magnification or in dimension.

In some embodiment only one of the processing steps 206 and 208 may be carried out. In some embodiments, both processing steps 206 and 208 may be carried out. In this latter case, processing steps 206 and 208 may be carried out during a single processing step.

The method 200 may comprise an optional step 210 for adjusting the position, on the top surface, of the measurement beam, according to the position data determined at step 206, so that the measurement beam is positioned accurately on the structure that is being characterized.

The position of the measurement beam on the top surface may be adjusted with a positioning unit. The positioning unit may comprise:

- a displacement stage for the interferometer and possibly the imaging unit, arranged to move at least the interferometer with respect to the plane of the top surface of the substrate, and/or
- a displacement stage for the substrate, arranged to move said substrate, or the chuck maintaining the substrate, with respect to the interferometer and possibly the imaging unit.

Again, steps 206 and 210 are optional so that in some embodiments the method according of the invention may not comprise these steps.

When the method 200 comprises the optional step 208 determining a top-CD data for the structure that is being characterized, said top-CD data may be used during step 104 for adjusting the diameter of the measurement beam on the surface of the substrate. Thus, the step 102 for reading the top-CD data may not have to be carried out.

If the method 200 doesn't comprise the optional step 208 determining a top-CD data for the structure that is being characterized, the method 200 may comprise step 102 for reading the top-CD data as described above for said structure.

The method 200 of FIG. 2 further comprises steps 104 and 106 as described above with reference to FIG. 1. In particular, it may comprise a positioning step 112 of the measurement beam as a function of the measurement signal, executed also by means of the positioning unit. This positioning step 120 may be carried out after the step 210 for adjusting the position of the measurement beam according to the position data, to refine or optimize the positioning. It may also be carried out without the step 210, for instance by using a pre-defined or previously stored position data.

Figure 3:
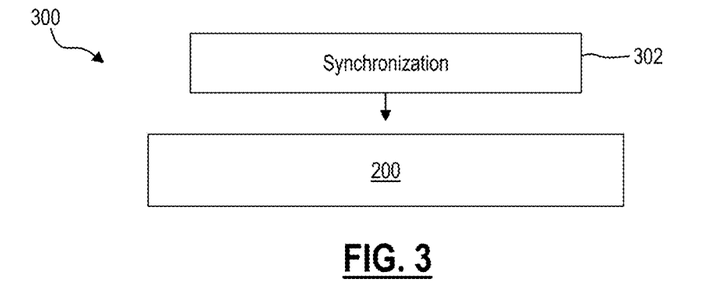

FIG. 3 is a diagrammatic representation of another non-limitative example of a method according to the present invention.

The method 300, shown in FIG. 3, may be used to characterise structures, and in particular HAR structures etched in a substrate, such as a wafer. More particularly, the method 300 of FIG. 3 may be used to measure the depth of structures etched in the substrate.

The method 300 comprises the steps described with reference to method 200 of FIG. 2.

The method 300 further comprises a synchronization step 302 so that the capturing step 204 and the interferometric measurement step 108 are carried out in turn so that said steps do not disturb each other. In particular, the synchronization step allows to prevent the measurement beam of the interferometer to reach, at least significantly, the top surface when the image capturing step 204 is carried out. This is important in particular when the image capturing step and the interferometric measurement step are carried out by using respective optical paths that have a common portion.

Such a synchronization may be done in different ways. The synchronization step may be done by:

controlling a position of a shutter located between the interferometer and the common portion:
- at a first position blocking the passage of the measurement beam, during the image capturing step 204, and
- a second position authorizing the passage of said measurement beam at least during the interferometric measurement step 108;

controlling a position of a mirror located between the interferometer and the common portion:
- at a first position deflecting the passage of the measurement beam away from the top surface, during the image capturing step 204; and
- a second position deflecting said measurement beam towards the top surface at least during the interferometric measurement step 108;

controlling a position of an optical density filter or a spectral filter located between the interferometer and the common portion:
- at first position filtering or attenuating most or the measurement beam, during the image capturing step 204; and
- at a second position letting the measurement beam to pass at least during the interferometric measurement step 108;

controlling an attenuation value of an attenuating device 606 located between the interferometer 410 and the common portion 510 so that:
- the measurement beam doesn't pass, at least significantly, towards the common portion during the image capturing step 204; and
- the measurement beam passes at least during the interferometric measurement step 108;

switching on and off an interferometer light source so that the measurement beam is not emitted during the image capturing step, and is emitted at least during the interferometric measurement step 108;

triggering the capturing of image(s) by the imaging unit with respect to the pulses of a pulsed light source of the interferometer, or reversely, or synchronizing both, such that the image acquisition is carried out between the pulses of said pulsed source.

Thus, in the method 300 of FIG. 3, the image of the top surface, or at least of the structure, is captured by the imaging unit without disturbance by the measurement beam emitted by the interferometer.

Figure 4A:
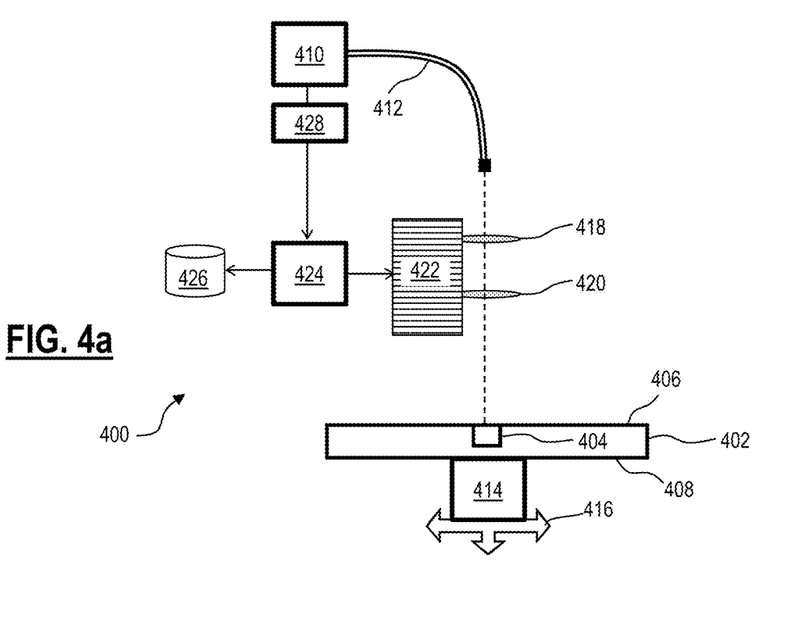
FIGS. 4a, 4b, 5-7 are diagrammatic representations of non-limitative examples of a system according to the invention.

FIG. 4a is a diagrammatic representation of a non-limitative example of a system according to the present invention.

The system 400, shown in FIG. 4a, may be used to characterise structures, and in particular HAR structures etched in a substrate, such as a wafer. More particularly, the system 400 may be used to measure the depth of structures etched in the substrate.

The system 400 may be used to carry out a method according to the invention, and especially the method 100 of FIG. 1.

As represented in FIG. 4a, the system 400 is used to characterize structures, and in particular HAR structures etched in a substrate 402, such as a wafer. In FIG. 4a, for ease of understating only one structure 404 is represented. Of course, the substrate may comprise more than one structure. The structure 404 may for example be a trench etched in the substrate 402 from the top surface 406 of the substrate 402. The substrate 402 also comprises a bottom surface 408 opposite to the top surface.

Figure 4B:
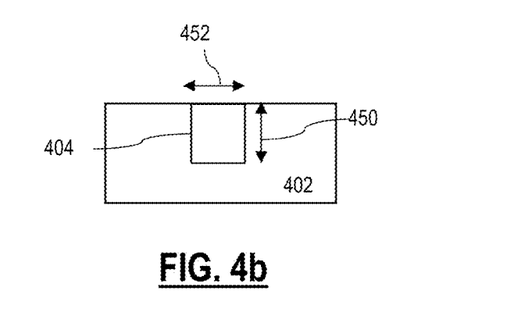

FIG. 4b illustrates the information to be measured on the structure 404 etched in a substrate 402, namely the depth 450 and possibly the top-CD 452. In the example illustrated, the structure 404 may be for instance a hole or a TSV, and the top-CD data 452 may be representative of the diameter at the top surface 406. The structure 404 may be also an elongated trench, and the top-CD 452 may be its smallest transverse dimension, or its width at the top surface 406.

The system comprises a low coherence interferometer 410 placed on the side of top surface 406 of the substrate 402. The low coherence interferometer 410 is used to characterize each structure of the substrate, and in particular to measure at least one data relative to the depth of the structure 404, and even more particularly to measure the depth of the structure 404.

The interferometer 410 may be for instance a time domain interferometer. In that case, it comprises a broadband source (not shown) emitting a polychromatic light. It further comprises an optical delay line which allows varying an optical path difference between two beams. When the optical path difference between the beams reflected respectively at the top and the bottom of the structure 404, or between these respective beams and a reference beam, is reproduced by the delay line, an interference burst, or fringe, can be observed on a photodetector, allowing measuring this optical path difference. The depth of the structure 404 is deducted from said optical path difference.

The interferometer may also be a spectral domain interferometer. In that case, it comprises a broadband source (not shown) emitting a polychromatic light, and a spectrometer for a spectral analysis of the reflected light. The spectrum obtained by combining the light reflected respectively by the top and the bottom of the structure 404 on the spectrometer exhibits well known patterns such as modulations whose analysis can provide the optical path difference between the superposed beams. The depth of the structure 404 is deducted from said optical path difference.

The interferometer 410 may also comprise a swept source interferometer, with a tunable laser emitting a monochromatic light with an optical frequency varying temporally over a spectral range. The intensity of the reflected light is measured by a photodetector, so as to reconstitute a spectrum, whose analysis allows also to measure the optical path difference between the reflected beams, and thus the depth of the structure 404.

The interferometer 410 may be for example similar to the one described in WO 2007/042676.

Optionally but preferably, the measurement beam emitted by the interferometer 410 and the reflected light received from the substrate 402 may be conveyed from and to the interferometer 410 using a single mode fiber 412 coupled to the interferometer 410.

For measuring narrow structures such as TSVs with high aspect ratio (HAR) and diameter smaller than 5 µm, the measurement light source may for example emit light in the visible spectral range, for instance <900 nm, for a better propagation into the structure.

The system 400 also comprises a holder 414, such as a wafer chuck, associated to displacement means 416, such as translation and/or rotary stages, to move and position the substrate 402 in the X-Y, and optionally Z, directions.

The system 400 also comprises means for adjusting the diameter on the top surface 406 of the substrate of the measurement beam emitted by the interferometer 410, in order to adjust the diameter of said measurement beam to the structure under inspection.

In the example shown in FIG. 4a, the diameter of the measurement beam may be determined by the core of the fiber 412 or the mode field diameter of the light exiting the fiber, and the magnification provided by the combination of a collimator lens 418 and a front side lens 420 such as a microscope objective. So, at least one of these lenses 418-420 can be changed in order to change the magnification, and thus to adjust the diameter of the measurement beam on the top surface 406.

The system 400 comprises a turret 422 for changing at least one of the lenses 418-420 and/or varying the focal length of one of the lenses 418-420, to change the magnification accordingly.

The system 400 may also comprise a beam expander (not shown) in a section where the measurement beam is collimated, such as between the collimator lens 418 and the front side lens 420. The beam expander modifies the beam diameter and therefore the numerical aperture (NA) with which the beam is focused. This finally defines the diameter of the measurement beam on the top surface 406.

The system 400 comprises a control unit 424 for controlling the means for adjusting the diameter of the measurement beam. In the example shown, the control unit 424 is configured to control the turret 422 for changing at least one of the lenses 418-420 in order to adjust the diameter of the measurement beam and to obtain a desired diameter for the measurement beam on the top surface 406.

In the system 400 shown on FIG. 4a, the adjustment of the diameter of the measurement beam on the top surface may be realized as a function of an a priori known top-CD data relating to the structure 404 that is being characterized.

The a priori known top-CD data is stored in a memory 426, that may be part of the system 400 or not. Thus, the control unit 424 reads the top-CD data of the structure 404 from the memory 426, optionally calculates a desired beam diameter for the measurement beam, or select a front side lens 418-420 according to a predefined recipe, and controls the turret 422 for ensuring that the proper lens is positioned on the measurement beam, in order to adjust the diameter of the measurement beam emitted by the interferometer 410 and obtain the desired beam diameter on the top surface 406.

As an alternative, or in addition, the measurement beam diameter on the top surface may also be adjusted as a function of at least one characteristic of the signal measured by the interferometer.

Such an adjustment of the diameter of the measurement beam may be done during the interferometric measurement, and allows adjustment of the measurement beam, especially in real condition and in real time, when the measured interferometric signal indicates that the diameter of the measurement beam is not adapted to the structure 404 that is being measured.

The at least one characteristic of the measured signal that may be used to adjust the diameter of the measurement beam on the top surface 406 may be, or may comprise, at least one of the following characteristics:

- a visibility or a modulation depth, possibly relative to an average value, of interference fringes or a spectral modulation of the measured interferometric signal, and/or
- an amplitude relative to the noise of the measured interferometric signal, and/or
- a value of depth data as provided by the interferometric signal.

To do this, the interferometer 410 may be configured to, or may comprise (or may be coupled to) a module 428 configured to, measure the value of said characteristic of the measured signal and compare said value to the expected value(s), or previous value(s) in an iterative process. The result of the comparison may be communicated to the control unit 424 for adjustment of the beam diameter by means of the turret 422, and/or a beam expender, as explained above.

Figure 5:
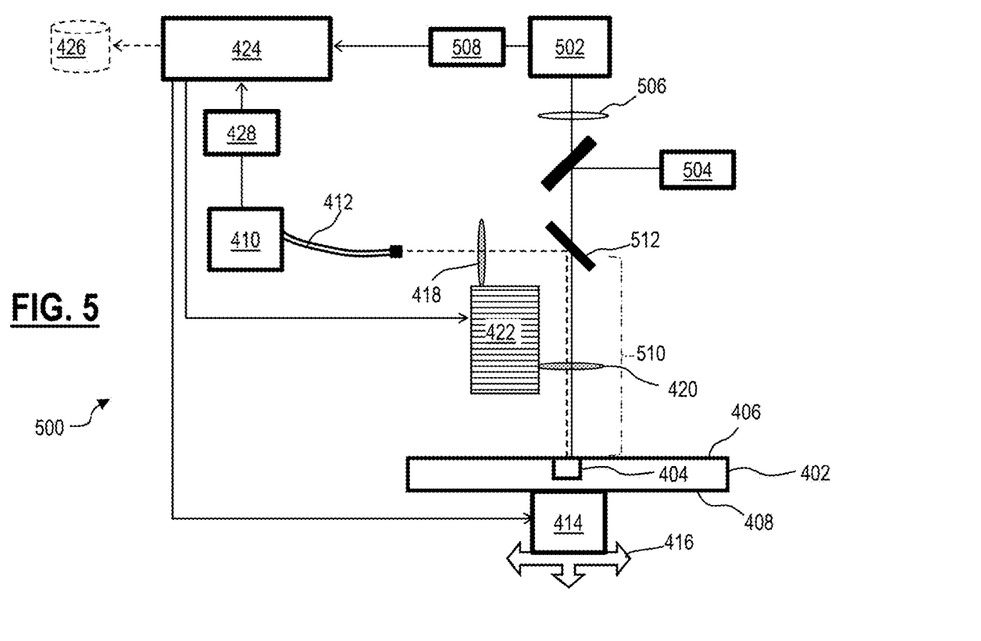

FIG. 5 is a diagrammatic representation of another non-limitative example of a system according to the present invention.

The system 500 of FIG. 5 may be used to carry out a method according to the invention, and especially any one of the methods 100, 200 or 300 of FIG. 1, 2 or 3.

The system 500 comprises all the components of the system 400.

The system 500 further comprises an imaging arrangement for capturing at least one image of the substrate 402, more particularly of the top surface 406 of the substrate 402, and processing said at least one captured image for determining at least one first data relative to at least one HAR structure of the substrate 402.

The imaging arrangement is arranged at the same side as the interferometer 410, i.e. on the side of the top surface 406 of the substrate 402.

In the non-limitative example shown in FIG. 5, the imaging arrangement comprises a camera 502 and, optionally, a light source 504. The imaging arrangement may also comprise the front side lens 420 and a tube lens 506 to image the top surface 406 of the substrate 402 on the camera 502.

The camera 502 is configured to capture/acquire at least one image of the top surface 406 of the substrate 402 comprising at least one HAR structure etched in said substrate. The captured image is processed, by standard image processing techniques executed by a processing module 508, for measuring a first data relative to at least one structure or a HAR structure. The processing module may include a hardware module, such as a processor or a chip, or a software module such as a computer program.

For at least one structure or a HAR structure, the first data may comprise the position of said structure, on the top surface 406. In this case, the position of the structure may be communicated to the control unit 424 to command/control the holder 414 and/or the stage 416, for accurate positioning of the measurement beam emitted by the interferometer 410 on said structure.

Alternatively, or in addition, for at least one structure or a HAR structure, the first data may comprise the top-CD of said structure. In this case, the top-CD of the structure may be communicated to the control unit 424 to command/control the turret 422 for adjusting the diameter, on the top surface 406, of the measurement beam emitted by the interferometer, as described above. In this case, the system 500 may not comprise the memory 426 and the top-CD may not be an a priori-known data.

As shown in FIG. 5, the interferometer 410 and the imaging arrangement operate with respective optical paths that have a common portion 510. In the example illustrated, this common portion 510 of the optical paths starts at the level of a mirror 512 that:
  reflects the measurement beam coming from the interferometer 410 towards the substrate 402, and the reflected beam coming from the substrate towards the interferometer 410;
  lets pass the imaging light coming from the light source 504 towards the substrate 402, and the reflected imaging light coming from the substrate 402 towards the camera 502;

In the example of FIG. 5, the common portion 510 of the optical paths comprises the front side lens 420.

Figure 6:
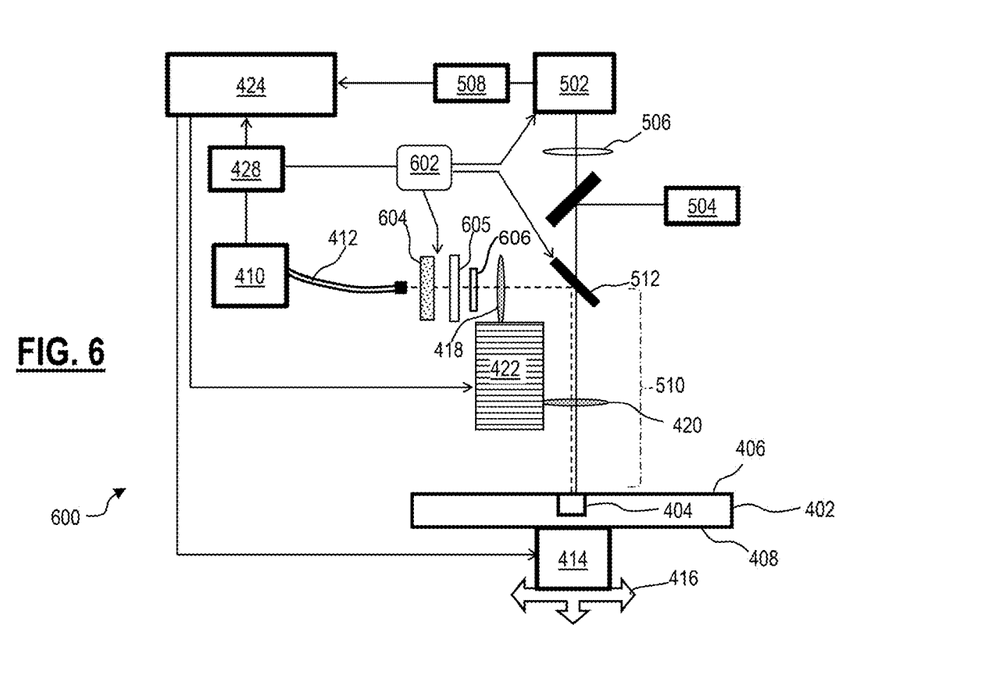

FIG. 6 is a diagrammatic representation of another non-limitative example of a system according to the present invention.

The system 600, shown in FIG. 6, comprises all the components of the system 500 of FIG. 5, except the memory 426.

In the system 600, it is considered that the first data provided by the processing module 508 comprises the top-CD, and/or the position, of the structure that is being characterized.

As shown in FIG. 6, and also in FIG. 5, the interferometer 410 and the imaging arrangement operates with a common optical path portion 510. In case the interferometer beam is visible by the camera, it may degrade or even prevent a proper imaging of the structure, due to the non-uniform illumination that it generates, or even cause a blurring of the camera. At the same time, the imaging light may disturb the interferometric measurement carried out with the interferometer 410. Thus, it may be advantageous to synchronize the interferometer 410 and the imaging arrangement in order to carry out interferometric measurement(s) and the acquisition of image(s), sequentially or in turn, and more generally not at the same time.

For this purpose, the system 600 comprise a synchronization controller 602, that may be a hardware unit such as a processor, a chip or even a computer, or a software module such as a computer program.

In the example shown, the synchronization controller 602 is configured to trigger the camera 502 between two pulses of a pulsed beam source (not shown) of the interferometer 410, or to trigger the pulsed light source between image acquisitions by the camera, or command both. Thus, the camera 502 captures, or acquires, at least one image when the measurement beam is not emitted by the interferometer 410.

As an alternative, or in addition, the mirror 512 may be controllably movable, and in particular rotary, and the synchronization controller 602 may be configured to command the position of said mirror. More particularly, the mirror 512 may be controllably rotary between:
  a first position deflecting the measurement beam away from the structure, or the top surface 406, that is being characterized, and
  a second position directing said measurement beam towards said structure, or top surface 406.

When the imaging step is carried out, the synchronization controller 602 commands the mirror to be in the first position: the measurement beam is deflected away from the structure and the image(s) may be captured by the camera. After the imaging step is carried out, the synchronization controller 602 commands the mirror to be in the second position: the measurement beam is directed towards the structure: interferometric measurement may be carried out.

Alternatively, or in addition, the system may comprise a controllable shutter 604 placed between the interferometer 410 and the mirror 512 in the example illustrated. The synchronization controller 602 may be configured to command the position of said controllable shutter 604. This shutter 604 may be controllable between:
  a "closed" position blocking the passage of the measurement beam coming from the interferometer, and
  an "open" position authorizing the passage of said measurement beam coming from the interferometer 410.

When the imaging step is carried out, the shutter 604 may be commanded to the closed position preventing the passage of the measurement beam. After the imaging step is carried out, the shutter may be commanded to the open position authorizing the passage of the measurement beam so that the interferometric measurement may be carried out.

Alternatively, or in addition, the system may comprise a movable optical filter 605, such as a neutral density or a spectral filter, placed between the interferometer 410 and the mirror 512 in the example illustrated, and mounted for instance in a filter wheel. The synchronization controller 602 may be configured to command the position of said movable optical filter 605 within the filter wheel. The position of that optical filter 605 may be controllable between:

a "closed" position filtering the measurement beam coming from the interferometer 410, and an "open" position authorizing the passage of said measurement beam coming from the interferometer 410.

When the imaging step is carried out, the movable optical filter 605 may be positioned to pass into the closed position preventing the passage of the measurement beam. After the imaging step is carried out, the movable optical filter 605 may be commanded to pass to the open position authorizing the passage of the measurement beam so that the interferometric measurement may be carried out.

Of course, other synchronization means may be used instead of or in combination with the synchronization means described with reference to FIG. 6, such as those indicated further above.

Figure 7:
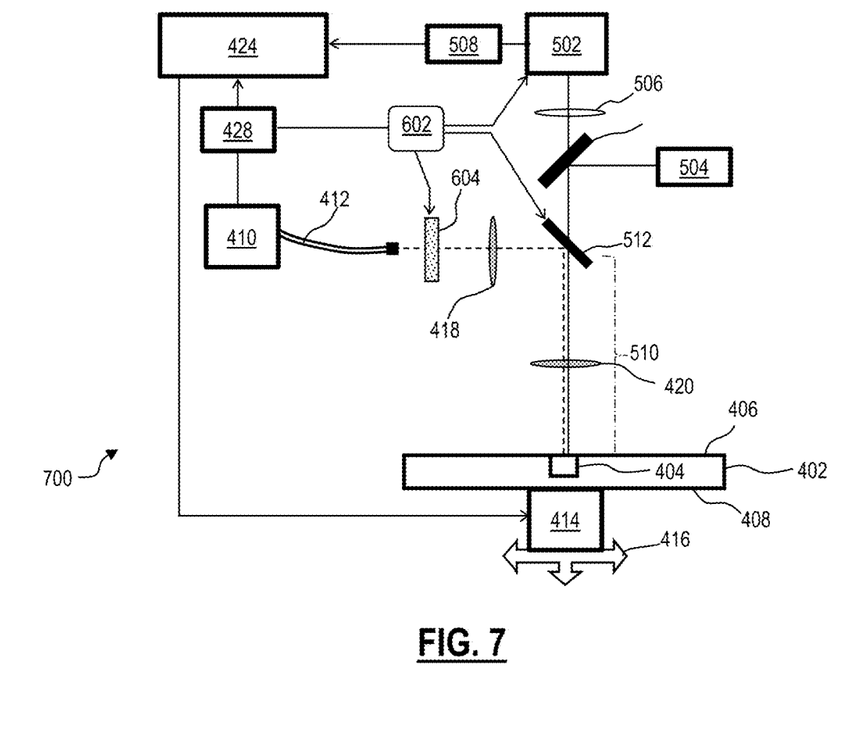

FIG. 7 is a diagrammatic representation of another non-limitative example of a system according to the present invention.

The system 700, shown in FIG. 7, comprises all the components of the system 600 of FIG. 6, except the turret 422.

In the system 700, the diameter of the measurement beam is not adjusted.

The first data provided by the imaging arrangement, and more particularly the processing module 508, relates to the position of the structure. The position data is used by the control unit 424 to adjust the position of the measurement beam on the top surface and place the measurement beam accurately on the structure or the HAR structure that is being characterized.

The system 700 however comprises the synchronization controller 602 controlling the camera with respect to a pulsed source of the interferometer, and/or the mirror 512 and/or the shutter 604, so that image capturing and interferometric measurement are realized in turn.

Of course, the invention is not limited to the examples detailed above.

While a particular embodiment of the present method and a system for characterising structures etched in a substrate, have been described herein, it will be appreciated by those skilled in the art that changes and modifications may be made thereto without departing from the invention in its broader aspects and as set forth in the following claims.

The invention claimed is:

1. A method for characterising structures etched in a substrate, comprising, for at least one structure:

an interferometric measurement step, carried out with a low-coherence interferometer positioned on a top surface of said substrate, for measuring with a measurement beam positioned on the at least one structure, at least one depth data relating to a depth of said at least one structure; and a first adjusting step for adjusting a diameter, at said top surface, of the measurement beam according to at least one top critical dimension ("top-CD") data relating to a width of said at least one structure;

wherein the diameter of said measurement beam is adjusted to be between 0.3 and 5 times the smallest transverse dimension of the at least one structure.

2. The method according to claim 1, characterized in that, for the at least one structure, the top CD-data is a priori known data, said method comprising, before the first adjusting step, a step for reading the top-CD data in a memory.

3. The method according to claim 1, further comprising a second adjusting step for adjusting the diameter of the measurement beam according to at least one characteristic of an interferometric signal measured by the interferometer.

4. The method according to claim 3, further comprising a third adjusting step for adjusting the position of the measurement beam relative to the structure according to at least one characteristic of an interferometric signal measured by the interferometer.

5. The method according to claim 1, further comprising an imaging step comprising the following steps:

capturing, with an imaging device positioned on the top surface of the substrate, at least one image of the top surface, and measuring a first data relating to the at least one structure from at least one captured image.

6. The method according to claim 5, characterized in that, for the at least one structure, the first data comprises the top-CD data used during the first adjusting step for adjusting the diameter of the measurement beam.

7. The method according to claim 4, characterized in that, for the at least one structure, the structure data comprises a position data relating to a position of the at least one structure on the top surface, said method also comprising a fourth adjusting step for adjusting the position, on said top surface, of the measurement beam according to said position data.

8. The method according to claim 5, characterized in that, the imaging step and the interferometric measurement step are carried out through respective light paths having a common portion, said method also comprising synchronization, by a synchronization unit, of said imaging step and said interferometric measurement step so that said steps are carried out sequentially.

9. The method according to claim 5, characterized in that the diameter of the measurement beam on the top surface is adjusted by changing:

at least one optical element placed between the interferometer and the top surface;

at least one focal length of an optical element placed between the interferometer and the top surface; and/or a numerical aperture of the measurement beam on the top surface.

10. A system for characterising high aspect ratio ("HAR") structures etched in a substrate, comprising:

a low-coherence interferometer, arranged on a top surface of said substrate, for measuring with a measurement beam positioned on the structure at least one depth data relating to a depth of said HAR structure; and an adjustment unit for adjusting a diameter, at said top surface, of the measurement beam according to at least one top critical dimension ("top-CD") data relating to a width of said HAR structure;

wherein the diameter of said measurement beam is adjusted to be between 0.3 and 5 times the smallest transverse dimension of the at least one structure.

11. The system according to claim 10, also comprising an imaging unit comprising:

an imaging device, arranged on the top surface of said substrate, for capturing at least one image of the top surface of said substrate; and a processing unit for measuring a first data relating to the structure from the at least one image captured by the imaging device.

12. The system according to claim 10, characterized in that said system further comprises a positioning unit for adjusting the position, on the top surface of the substrate, of the measurement beam.

13. The system according to claim 10, characterized in that, for adjusting the diameter, on the top surface, of the measurement beam, the adjustment unit comprises at least one of the following:
- a turret for changing at least one optical element placed on the path of the measurement beam between the interferometer and the top surface;
- an optical element with adjustable focal length, placed on the path of the measurement beam between the interferometer and the top surface; and/or
- a beam expander with adjustable numerical aperture, placed on the path of the measurement beam between the interferometer and the top surface.

14. The system according to claim 11, wherein respective light paths of the imaging unit and of the interferometer have a common portion, said system also comprising a synchronization unit so that said imaging unit and said interferometer are used sequentially.

15. The system according to claim 14, characterized in that, the synchronization unit comprises at least one of the following:
- a shutter located between the interferometer and the common portion, and moveable between a first position blocking the passage of the measurement beam and a second position authorizing the passage of said measurement beam;
- a mirror located between the interferometer and the common portion, and moveable between a first position deflecting the passage of the measurement beam away from the structure and a second position deflecting said measurement beam towards said structure;
- an optical filter located between the interferometer and the common portion, and moveable between a first position filtering the measurement beam and a second position letting the measurement beam pass;
- an attenuating device located between the interferometer and the common light path portion, the attenuation value of which is controllable;
- a controller switching on and off an interferometer light source; and/or
- a controller controlling the imaging device and/or the light source so as to trigger acquisition of at least one image by the imaging device with respect to the pulses of a pulsed light source of the interferometer such that image acquisition is carried out between the pulses of said source.

* * * * *